United States Patent
Yeh et al.

(10) Patent No.: US 7,341,943 B2
(45) Date of Patent: Mar. 11, 2008

(54) POST ETCH COPPER CLEANING USING DRY PLASMA

(75) Inventors: Chen-Nan Yeh, Hsi-Chih (TW); Miao-Ju Hsu, Bei-kong (TW); Hun-Jan Tao, HsinChu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 340 days.

(21) Appl. No.: 11/053,018

(22) Filed: Feb. 8, 2005

(65) Prior Publication Data

US 2006/0178008 A1  Aug. 10, 2006

(51) Int. Cl.
*H01L 21/44* (2006.01)
(52) U.S. Cl. .............................. 438/677; 257/E21.576; 257/E21.577; 438/735
(58) Field of Classification Search ................ 438/677, 438/735, 906; 257/E21.576, E21.577
See application file for complete search history.

(56) References Cited

U.S. PATENT DOCUMENTS 7,084,070 B1 * 8/2006 Lee et al. .................... 438/714

2002/0162736 A1 * 11/2002 Ngo et al. ............. 204/192.12
2004/0137750 A1 * 7/2004 Nemoto et al. ............. 438/719

OTHER PUBLICATIONS

M.R. Baklanov et al., Characterization of Cu Surface Cleaning by Hydrogen Plasma, J. Vac. Sci. Technol. B 19(4), Jul./Aug. 2001, pp. 1201-1211.
Tsung-Kuei Kang and Wei-Yang Chou, Avoiding Cu Hillocks During the Plasma Process, Journal of the Electrochemical Society, 151 (6) pp. G391-G395, (2004).

* cited by examiner

*Primary Examiner*—Caridad Everhart
(74) *Attorney, Agent, or Firm*—Duane Morris LLP

(57) ABSTRACT

A method for post-etch copper cleaning uses a hydrogen plasma with a trace gas additive constituting about 3-10 percent of the plasma by volume to clean a copper surface exposed by etching. The trace gas may be atomic nitrogen or other species having an atomic mass of 15 or greater. The trace gas adds a sputtering aspect to the plasma cleaning and removes polymeric etch by-products and polymeric and other residuals formed during the deposition of dielectric materials or etch stop layers over the copper surface. An anti-corrosion solvent may be used to passivate the copper surface prior to formation of the dielectric materials or etch stop layers.

20 Claims, 2 Drawing Sheets

POST ETCH COPPER CLEANING USING DRY PLASMA

FIELD OF THE INVENTION

The present invention relates most generally to semiconductor devices and methods for their fabrication. More particularly, the present invention is directed to a cleaning method and structure that provide copper contact structures with low contact resistance.

BACKGROUND

The use of copper as a conductive interconnect material is favored in semiconductor devices because of the high speed that copper provides. Copper is difficult to pattern and therefore copper interconnect leads are typically formed using damascene processing technology whereby an opening is formed in a dielectric, copper is deposited over the dielectric and within the opening, then a polishing/planarization process is used to remove copper from over the dielectric, leaving the copper inlaid within the opening. The inlaid copper includes an upper surface that is essentially co-planar with the top surface of the dielectric in which the copper is disposed. A shortcoming associated with the use of copper interconnect technology is that the exposed copper surfaces are prone to oxidation. Thus, according to conventional processing technology, a passivation or other oxidation-prevention operation is carried out after the copper surface is formed by polishing. The materials conventionally used to passivate the copper surface after polishing, however, may complex with species used in the formation of further materials over the passivated copper surface, to form undesirable contaminants.

Contact may be made to the copper surface by forming a further dielectric and further optional materials over the copper surface then etching an opening through the dielectric and the further optional materials that exposes the copper surface. In one exemplary embodiment after the polishing process forms copper interconnect structures inlaid within a dielectric, a further dielectric is formed over the structure. An etch stop layer may optionally be formed between the overlying further dielectric and the polished surface. During the deposition of such an etch stop layer, organosilicate (SiOCH) contaminants may be formed at the interface between the etch stop layer and the passivated copper surface. SiC used during the initial deposition of an etch stop layer may complex with the anti-corrosion passivated surface of copper to form the organosilicate. When the optional etch stop layer is not used, contaminants may be formed during the initial stages of the further dielectric deposition. An etching operation is then carried out to etch through the further dielectric and the optional etch stop layer exposing portions of the copper surface for the purpose of providing contact to the copper surface. Applicants have noted that, regardless of the condition of the copper surface prior to the formation of the subsequent film such as the optional etch-stop film and/or the overlying dielectric, the plasma etching processes used to etch the opening that exposes the copper surface leave contaminating etch residuals and by-products that degrade the quality of the exposed copper surface and result in undesirably increased contact resistance. It would therefore be desirable to address the integrity of the copper surface after the etching operation. The etch residuals are generally polymeric in nature and difficult to remove.

The polymeric etch residuals and by-products may include fluorine, F, carbon, C, copper, Cu and other species in various combinations. Hydrogen, $H_2$, plasmas are conventionally used in the art of semiconductor manufacturing to remove polymeric etch by-products and residuals such as those formed due to the deposition of the etch stop layer or dielectric or during the etching operation that exposes the copper surface. Hydrogen plasmas, however, are extremely sensitive to the condition of the plasma chamber and therefore run-to-run repeatability is difficult to achieve. The via resistance for the vias formed to contact the copper surface, is dependent upon the hydrogen plasma clean and is therefore also susceptible to changes in chamber conditions and therefore unstable. Often, when a hydrogen plasma is used for cleaning, a further cleaning operation must be used due to the aforementioned shortcomings.

It would therefore be desirable to provide a robust cleaning procedure that insures that the copper surfaces upon which further conductive materials are formed, are clean, and that via resistance is thereby minimized.

SUMMARY OF THE INVENTION

To address these and other needs and in view of its purposes, an aspect of the invention provides a method for providing contact to copper in a semiconductor device. The method comprises providing a copper surface, treating the copper surface with an anti-corrosion element, forming a dielectric layer over the copper surface, etching an opening through the dielectric layer and exposing the copper surface, and cleaning in a plasma that includes a plasma gas comprising hydrogen and a further component having an atomic mass of 15 or greater. The further component comprises about 3 to 10 percent by volume of the plasma gas and provides a sputtering aspect to the cleaning method.

Another aspect of the invention provides a method for providing contact to copper in a semiconductor device. The method comprises providing a copper surface, treating the copper surface with an anti-corrosion element, forming a dielectric layer over the copper surface, etching an opening through the dielectric layer and exposing the copper surface, and cleaning in a plasma that includes a plasma gas comprising hydrogen and nitrogen, with the nitrogen comprising about 3-10 percent by volume of the plasma gas.

BRIEF DESCRIPTION OF THE DRAWING

The present invention is best understood from the following detailed description when read in conjunction of the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

Figure 1:
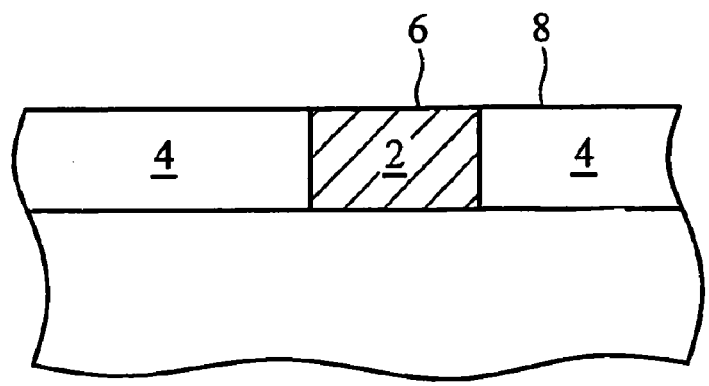
FIG. 1 is a cross-sectional view showing a copper structure inlaid within a dielectric.

FIG. 1 is a cross-sectional view showing copper structure 2 inlaid within dielectric 4 according to damascene processing technology. A polishing operation such as chemical mechanical polishing may be used to form the structure which includes top surface 6 of copper structure 2 and top surface 8 of dielectric 4 which are substantially co-planar. Dielectric 4 may be any of various suitable dielectrics used in semiconductor manufacturing, including low-k dielectric materials and various oxides and oxynitrides. After the structure shown in FIG. 1 is formed, top surface 6 of copper structure 2 may be passivated using conventional techniques. According to one exemplary embodiment, the passivation process may include treating with an anti-corrosion solvent such as BTA (Benzotriazole) using conventional methods, but other anti-corrosion solvents and other passivation techniques may be used in other exemplary embodiments. In still further exemplary embodiments, the passivation technique may not be used.

Figure 2:
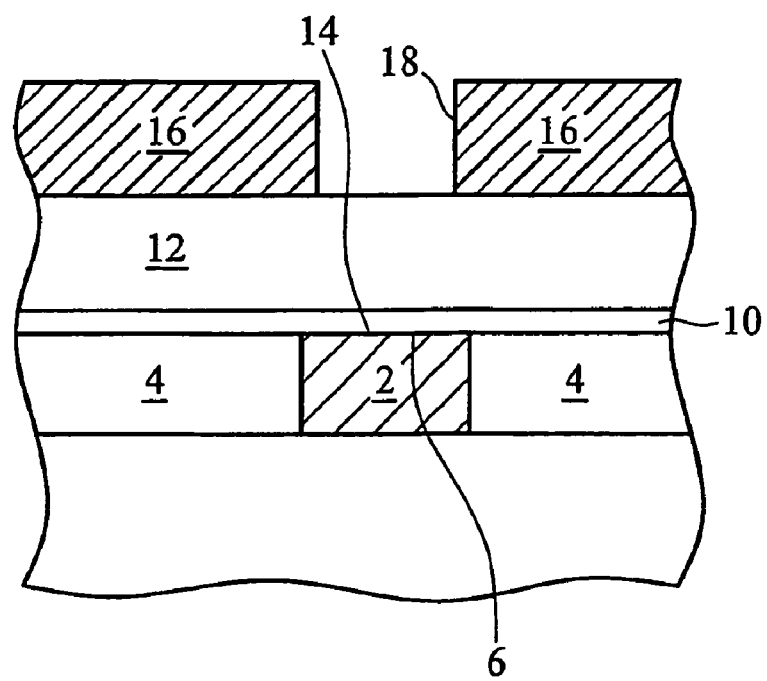
FIG. 2 is a cross-sectional view showing the structure FIG. 1 after an etch stop layer and dielectric have been formed over the structure.

FIG. 2 shows the structure of FIG. 1 after optional etch stop layer 10 and upper dielectric 12 having been formed, using conventional methods, over top surface 8 and top surface 6. CVD, chemical vapor deposition, or other formation techniques, may be used to form optional etch stop layer 10 and upper dielectric 12. Upper dielectric 12 may be any of various suitable dielectrics such as silicon oxides, silicon oxynitrides, silicon nitrides, or various low-k dielectric materials. Etch stop layer 10 is chosen to have different etching characteristics than upper dielectric 12, in particular, etch stop layer 10 is chosen to be resistant to the etching characteristics used to etch upper dielectric 12. According to one exemplary embodiment, etch stop layer 10 may be silicon carbide but other materials such as silicon nitride may be used in other exemplary embodiments. In some exemplary embodiments, organosilicate (SiOCH) species may undesirably form at interface 14 formed between top surface 6 of copper structure 2 and etch stop layer 10, during the formation of etch stop layer 10. According to the embodiments in which etch stop layer 10 is not used, other contaminating species may form on top surface 6 during the formation of upper dielectric 12. In each of the aforementioned exemplary embodiments, the contaminating species may be a product of species used to passivate the copper surface complexing with the species used to form upper dielectric 12 or optional etch stop layer 10.

Photoresist film 16 is formed over upper dielectric 12 according to conventional techniques and includes opening 18 aligned over top surface 6 of copper structure 2. Conventional etching techniques are then used to form an opening that exposes top surface 6 for the purpose of providing an electrical connection to top surface 6.

Figure 3:
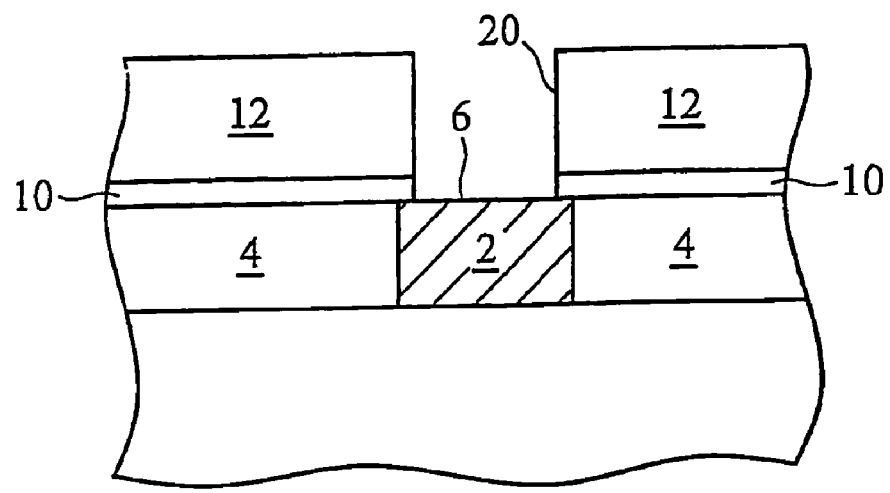
FIG. 3 is a cross-sectional view showing the structure of FIG. 2 after an opening has been formed to expose a surface of the copper.

FIG. 3 shows the structure of FIG. 2 after a conventional plasma etching operation or a sequence of plasma etching operations, has been carried out to etch through upper dielectric 12 and optional etch stop layer 10 to expose a portion of top surface 6 of copper structure 2, and after the subsequent removal of the photoresist film shown in FIG. 2. Opening 20 is formed by plasma etching and often results in polymeric residual materials and etch by-product materials formed on top surface 6 and which can increase the resistance of a contact formed by forming a conductive material within opening 20 that contacts top surface 6. The polymeric etch residuals and by-products may include fluorine, F, carbon, C, copper, Cu and other species in various combinations. For example, various $CF_x$ compounds may be produced. Opening 20 may be a via in an exemplary embodiment or it may be single or dual damascene trench, but other openings that expose top surface 6 of copper structure 2 may be used in other exemplary embodiments.

After the structure shown in FIG. 3 is formed by etching, an aspect of the present invention provides a cleaning operation that effectively removes residual and by-product material from opening 20 and from top surface 6. The cleaning operation effectively removes organosilicate (SiOCH) species which may have formed at interface 14 and which may still undesirably exist on top surface 6. The cleaning operation also capably removes etch residuals and by-products such as $CF_x$ and others that may include fluorine, F, carbon, C, copper, Cu or various other species. The cleaning procedure is a plasma cleaning operation that includes hydrogen and a trace gas that has an atomic mass of 15 or greater. In an exemplary embodiment, the trace gas may be atomic nitrogen, $N_2$ but other suitable trace gasses may be used in other exemplary embodiments. The hydrogen:trace gas ratio may range from 10:1 to 50:1 by volume but other ratios may be used in other exemplary embodiments. The trace gas may represent 2-10% or 3-10%, by volume, of the plasma gas. The atomic mass of 15 or greater provides a sputtering aspect of the cleaning operation. In one exemplary embodiment, the cleaning operation may include a ratio of hydrogen:nitrogen of 20:1. In an exemplary embodiment, a gas flow of 400 sccm $H_2$ and 20 sccm $N_2$ may be used at a pressure of 60 millitorr and at a source power of 400 watts and a bias power of 150 watts of an inductively coupled plasma. In other exemplary embodiments, the pressure used in the cleaning chamber may range from 10 mT to 200 mT. Also in other exemplary embodiments, the power for performing the cleaning operation may range from 100 W to 2000 W. Due to the sputtering aspect provided by the trace gas, the cleaning operation is not very sensitive to the condition of the cleaning chamber.

Figure 4:
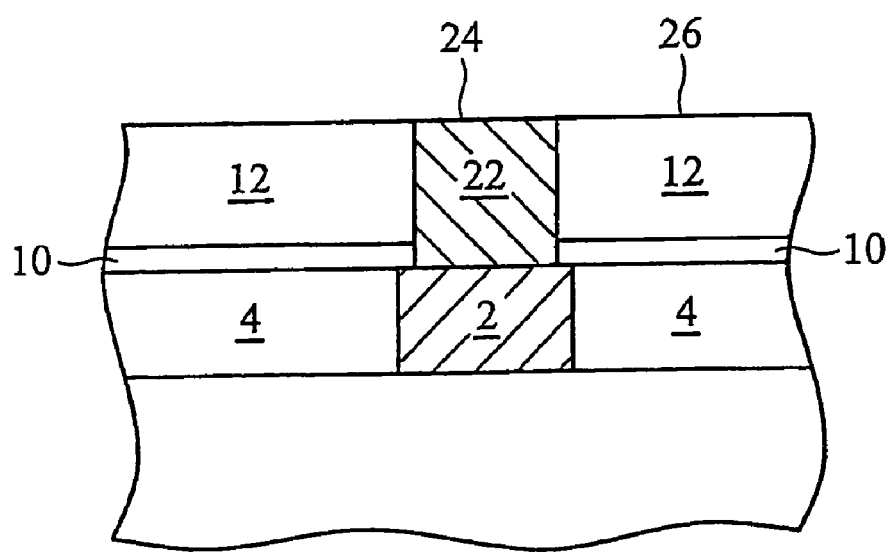
FIG. 4 is a cross-sectional view showing the structure of FIG. 3 after the opening has been filled with an conductive material.

After the plasma cleaning operation is concluded, a conductive material is formed within opening 20 to contact cleaned top surface 6. FIG. 4 shows conductive material 22 filling opening 20 shown in FIG. 3. Copper or other suitable conductive materials may be used. The exemplary structure shown in FIG. 4 also shows top surface 24 of conductive material 22 being substantially co-planar with upper surface 26 of upper dielectric 12 such as may be produced after a polishing operation such as used in damascene processing technology, but other methods for forming a conductive structure within opening 20 (FIG. 3) and contacting top surface 6 of copper structure 2, may be used in other exemplary embodiments.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is-intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for providing contact to copper in a semiconductor device, comprising:
   providing a copper surface;
   treating said copper surface with an anti-corrosion solvent before forming any further layer thereover;
   forming a dielectric layer over said copper surface after said treating;
   etching an opening through said dielectric layer and exposing said copper surface; and
   cleaning with a plasma that includes a plasma gas consisting of hydrogen and a further component having an atomic mass of 15 or greater, said further component comprising about 3-10 percent by volume of said plasma gas.

2. The method as in claim 1, wherein said etching comprises plasma etching and creates polymeric etch residue on said copper surface and said cleaning removes said polymeric etch residue.

3. The method as in claim 1, wherein said anti-corrosion solvent comprises BTA (Benzotriazole) and said treating passivates said copper surface.

4. The method as in claim 1, further comprising forming an etch stop layer between said copper surface and said dielectric layer after said treating, and wherein said etching further comprises etching an opening through said etch stop layer, said forming an etch stop layer forms contaminants on said copper surface, and said cleaning removes said contaminants.

5. The method as in claim 1, wherein said cleaning takes place at pressure of about 60 millitorr, includes a power within a range of 150-400 watts and a gas flow of about 400 scorn hydrogen and about 20 sccm of said further component.

6. The method as in claim 1, further comprising forming a conductive material in said opening and contacting said copper surface.

7. A method for providing contact to copper in a semiconductor device, comprising:
   providing a copper surface;
   treating with an anti-corrosion solvent;
   forming a dielectric layer over said copper surface;
   etching an opening through said dielectric layer and exposing said copper surface; and
   cleaning with a plasma that includes nitrogen and hydrogen, said plasma including a volume percentage of nitrogen ranging from about 3 to 10 percent.

8. The method as in claim 7, wherein said anti-corrosion solvent comprises BTA (Benzotriazole).

9. The method as in claim 7, further comprising forming an etch stop layer between said copper surface and said dielectric layer after said treating, and wherein said etching further comprises etching an opening through said etch stop layer, said forming an etch stop layer forms polymeric contaminants on said copper surface, and said cleaning removes said polymeric contaminants.

10. The method as in claim 7, wherein said copper surface is formed by chemical mechanical polishing.

11. The method as in claim 7, wherein said opening comprises a via.

12. The method as in claim 7, wherein said opening comprises a dual damascene opening and said copper surface is a top surface of copper material formed in a further opening formed in a subjacent dielectric material.

13. The method as in claim 7, wherein said cleaning takes place at a pressure of about 60 millitorr and a power within a range of 150-400 watts.

14. The method as in claim 7, wherein said cleaning includes a nitrogen gas flow of about 20 sccm and a hydrogen gas flow of about 400 sccm.

15. The method as in claim 7, further comprising forming a conductive material in said opening, said conductive material contacting said copper surface.

16. The method as in claim 7, further comprising forming an etch stop layer between said copper surface and said dielectric layer, and wherein said ething further comprises etching an opening through said etch stop layer using a plasma etching operation.

17. The method as in claim 13, wherein said etch stop layer is formed of silicon carbide or silicon nitride.

18. The method as in claim 7, wherein said etching comprises plasma etching.

19. The method as in claim 18, wherein said etching creates polymeric etch residue on said copper surface and said cleaning removes said polymeric etch residue.

20. A method for providing contact to copper in a semiconductor device, comprising:
   providing a copper surface;
   treating with an anti-corrosion solvent;
   forming a dielectric layer over said copper surface;
   etching an opening through said dielectric layer and exposing said copper surface; and
   cleaning with a plasma that includes a plasma gas comprising hydrogen and a further component having an atomic mass of 15 or greater, said further component comprising about 3-10 percent by volume of said plasma gas, wherein said cleaning takes place at pressure of about 60 millitorr, includes a power within a range of 150-400 watts and a gas flow of about 400 sccm hydrogen and about 20 sccm of said further component.

* * * * *

UNITED STATES PATENT AND TRADEMARK OFFICE
CERTIFICATE OF CORRECTION

PATENT NO. : 7,341,943 B2
APPLICATION NO. : 11/053018
DATED : March 11, 2008
INVENTOR(S) : Chen-Nan Yeh, Miao-Ju Hsu and Hun-Jan Tao Page 1 of 1

It is certified that error appears in the above-identified patent and that said Letters Patent is hereby corrected as shown below:

Column 5, line 1, delete "is-in-" and insert -- is in- -- therefor.

Column 5, line 51, delete "scorn", and insert -- sccm -- therefor.

Signed and Sealed this

Second Day of September, 2008

JON W. DUDAS
*Director of the United States Patent and Trademark Office*